United States Patent
Aude et al.

(10) Patent No.: US 6,859,387 B1
(45) Date of Patent: Feb. 22, 2005

(54) THREE-STATE BINARY ADDERS AND METHODS OF OPERATING THE SAME

(75) Inventors: Arlo J. Aude, Atlanta, GA (US); Laurence D. Lewicki, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/569,954

(22) Filed: May 12, 2000

(51) Int. Cl.[7] .......................... H03M 1/12; H03M 1/38
(52) U.S. Cl. ...................................... 365/155; 341/161
(58) Field of Search ............................... 341/118, 143, 341/155, 161

(56) References Cited

U.S. PATENT DOCUMENTS

| | | | | |
|---|---|---|---|---|
| 5,638,071 A | * | 6/1997 | Capofreddi et al. | 341/118 |
| 5,710,563 A | * | 1/1998 | Vu et al. | 341/161 |
| 5,982,314 A | * | 11/1999 | Amar et al. | 341/143 |
| 6,124,820 A | * | 9/2000 | Norman | 341/161 |
| 6,222,477 B1 | * | 4/2001 | Irie et al. | 341/161 |

* cited by examiner

*Primary Examiner*—Trong Phan

(57) ABSTRACT

Three-state binary adders are disclosed for use in pipelined analog-to-digital converters. According to one advantageous embodiment, a three-state binary adder is provided for use in a digital signal processing system. The three-state binary adder is operable to generate binary codes consisting of three states, namely, "00", "01" and "10."

20 Claims, 6 Drawing Sheets

FIG. 3
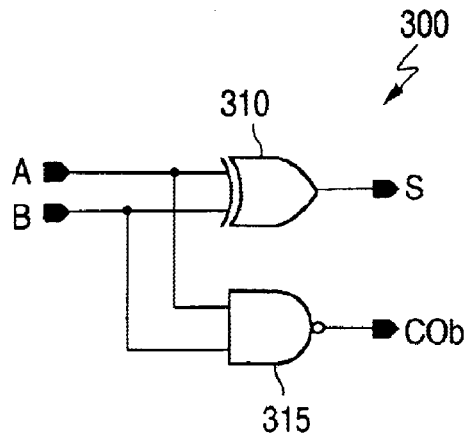
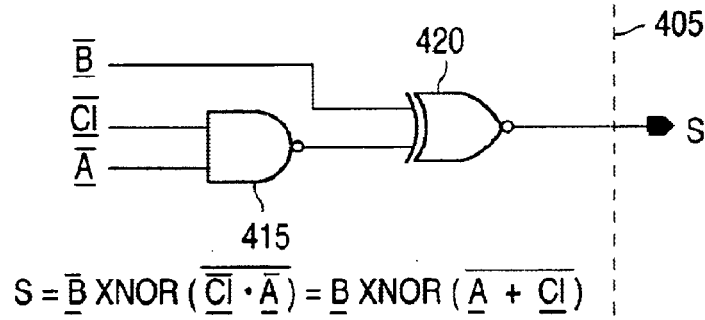
$S = \underline{\overline{B}} \text{ XNOR } (\overline{\overline{\underline{CI}} \cdot \underline{\overline{A}}}) = \underline{B} \text{ XNOR } (\underline{A} + \underline{CI})$
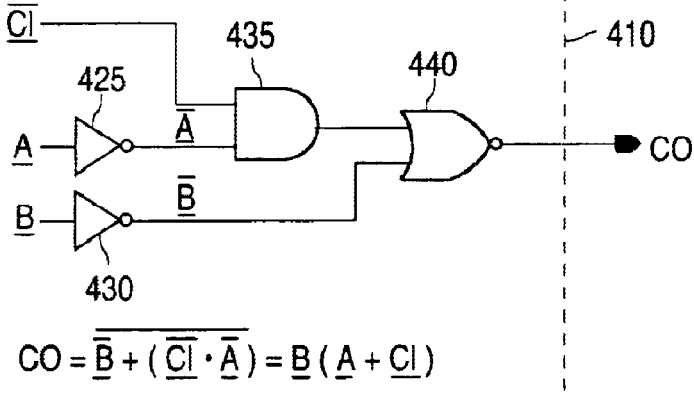
$CO = \overline{\underline{\overline{B}} + (\overline{\overline{\underline{CI}} \cdot \underline{\overline{A}}})} = \underline{B}(\underline{A} + \underline{CI})$
FIG. 4

THREE-STATE BINARY ADDERS AND METHODS OF OPERATING THE SAME

CROSS REFERENCE TO RELATED APPLICATIONS

The present invention is related to that disclosed in U.S. patent application Ser. No. 09/569,955, entitled "THREE-STATE BINARY ADDERS WITH ENDPOINT CORRECTION AND METHODS OF OPERATING THE SAME," which application is commonly assigned to the Assignee of the present invention and filed May 12, 2000. The disclosure of this related patent application is incorporated herein by reference for all purposes as if fully set forth herein.

TECHNICAL FIELD OF THE INVENTION

The present invention relates generally to optimized adders, and more specifically to three-state binary adders for use in pipelined analog-to-digital converters.

BACKGROUND OF THE INVENTION

Conventional data conversion devices often include an analog-to-digital converter ("ADC").

ADCs operate primarily to quantize analog data signals for use in digital signal processing. In recent years, the need for more powerful digital signal processing systems has continued to increase, thereby requiring higher resolution and more accurate ADCs.

Conventional ADCs have commonly employed switched capacitor elements and differential amplifiers. These switched capacitor elements, in order to obtain the necessary accuracy, must be accurately matched, thereby requiring the manufacturing process to achieve high levels of accuracy, which may be difficult due to matching limitations between components. Since these limitations commonly exceed manufacturing process capabilities, various calibration techniques have been implemented.

Conventional ADCs address various ones of the above-noted disadvantages. One such conventional ADC is known as a "pipelined ADC." A pipelined ADC operates to convert an analog signal received at the input of a pipeline of "n" stages into an "n"-bit digital output signal. Each converter stage is, essentially, a sub-ADC and a reconstructing digital-to-analog converter ("DAC").

For instance, in a typical pipelined ADC, a "first" stage receives the analog input voltage and, in response to the analog level, converts the same to generate the most significant bit ("MSB") of the resulting digital signal. Subsequent stages in turn refine the determination of the value of the signal, producing additional bits in less significant positions of the resulting digital signal.

More specifically, an initial "coarse" conversion of a voltage $V_{IN}$ is made by a $n^{th}$-bit sub-ADC, which coarse conversion is a $n^{th}$-bit approximation of the input voltage $V_{IN}$. Commonly, a $n^{th}$-bit DAC converts this $n^{th}$-bit digital approximation back into an analog signal, which represents the "coarse" $n^{th}$-bit approximation of the input voltage $V_{IN}$. This "$n^{th}$-bit" analog signal is then subtracted from the actual input voltage $V_{IN}$, and the resulting remainder, or "residue," of the first $n^{th}$-bit conversion represents the residual portion of the input voltage $V_{IN}$ that was not accurately converted by the $n^{th}$-bit sub-ADC.

This residual portion is amplified to enlarge the conversion range for a second or "finer" conversion performed by a $m^{th}$-bit sub-ADC. This "finer" $m^{th}$-bit digital approximation of the input voltage $V_{IN}$ by the $m^{th}$-bit sub-ADC is passed to an adder where it is added to the "coarse" $n^{th}$-bit conversion previously performed by the $n^{th}$-bit sub-ADC.

This multi-stage process is repeated until the pipeline is complete, with the residue of each stage being amplified and quantized by the following stage. The limiting example of such an extension is a one-bit-per-stage architecture, which requires only one comparator per added bit of resolution desired. The gain of the inter-stage amplifier is set such that coarse and fine conversions have a one-bit overlap so as to allow for the correction of errors made in the coarse conversion.

Multi-stage pipeline ADC architectures provide a scalable approach that reduces significantly the total number of comparators required to perform a conversion. This reduction in the number of required comparators results in a significant die area and power consumption savings for the ADC.

Traditional correction logic in a pipelined ADC is implemented as "full" addition and carry over of the overlapping correction bits from each stage. Each full adder however provides for four possible states (e.g., "00," "01," "10," "11"), one state more than a pipelined binary adder requires (e.g., "00," "01," "10"). A need therefore exists in the art for a binary adder that further increases the efficiencies of pipelined ADCs and reduces die area and power consumption requirements of the ADC. A further need exists for a three-state binary adder that eliminates the logic necessary for a "11" state in pipelined ADCs.

SUMMARY OF THE INVENTION

To address the above-discussed deficiencies of the prior art, it is a primary object of the present invention to provide optimized adders and, more specifically, three-state binary adders for use in pipelined analog-to-digital converters. According to one advantageous embodiment, a three-state binary adder is provided for use in a digital signal processing system. The three-state binary adder is operable to generate binary codes consisting of three states, namely, "00", "01" and "10". Important aspects hereof, which include use of three-state binary adders in pipelined analog-to-digital converters, as well as other digital signal processing systems, is ease of scalability, delay reductions, and reduced area relative to an overlapping adder using standard full-adder and half-adder cells.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION, below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which:

FIG. 3 illustrates a block diagram of a first one of three corrected adder cells that may be used to reduce the circuit logic to generate a three-state binary adder according to the principles of the present invention;

FIG. 4 illustrates a block diagram of a second one of three corrected adder cells that may be used to reduce the circuit logic to generate a three-state binary adder according to the principles so the present invention;

DETAILED DESCRIPTION OR THE INVENTION

FIGS. 1 through 8, discussed below, and the various embodiments used to describe the principles of the present invention in this patent document are by way of illustration only and should not be construed in any way to limit the scope of the invention. Those skilled in the art will understand that the principles of the three-state binary adder and methods of operating the same set forth herein may be implemented in any suitably arranged digital signal processing circuitry or system.

Figure 1:
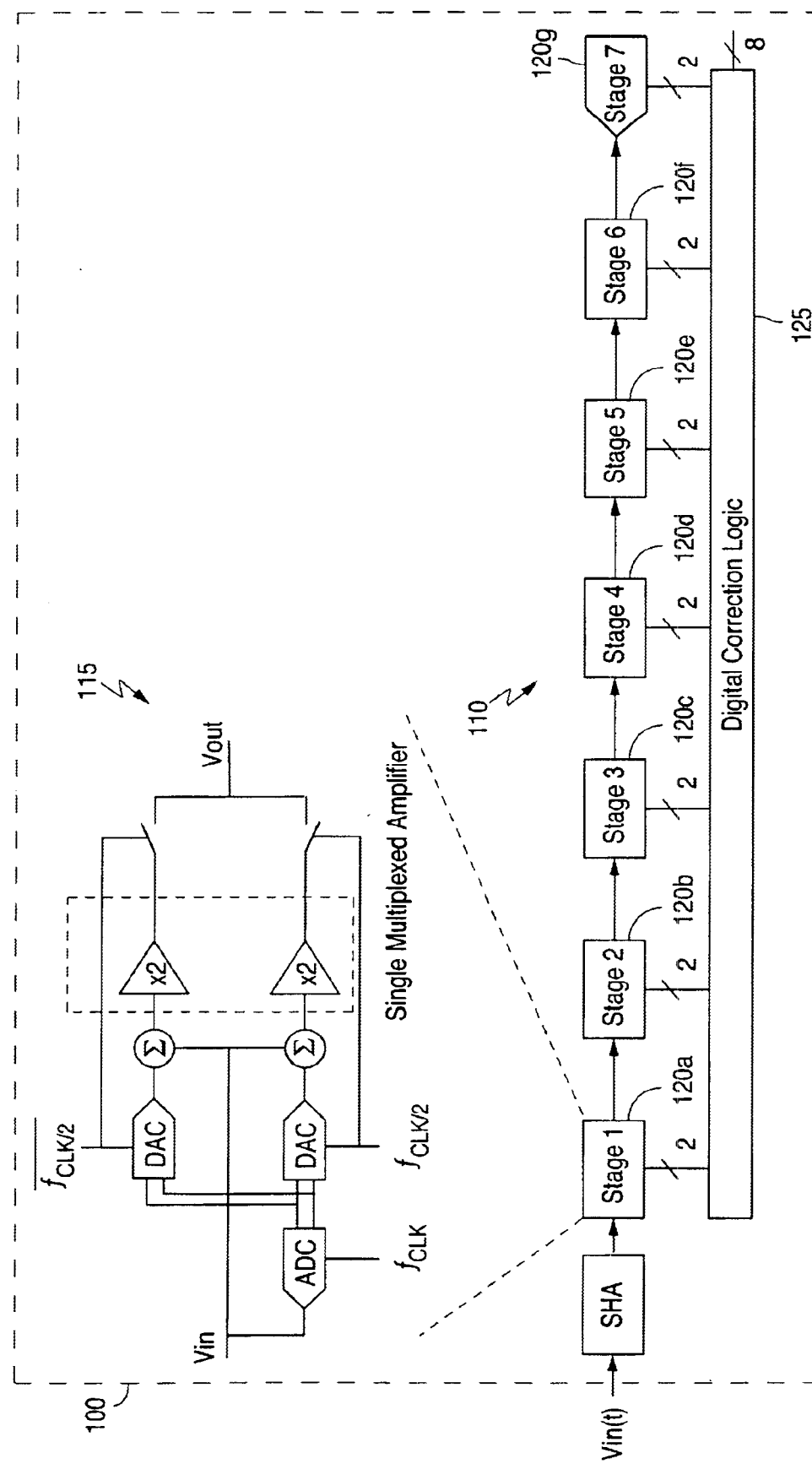
FIG. 1 illustrates a block diagram of a prior art digital signal processing system having an analog-to-digital converter.

Turning initially to FIG. 1 illustrated is a block diagram of an exemplary prior art digital signal processing system 100 including an analog-to-digital converter ("ADC", generally designated 110) which may suitably employ a three-state binary adder of the type constructed in accordance with the principles of the present invention. Digital signal processing system 100 is illustratively an Ethernet physical layer system. Exemplary ADC 110 is a pipelined 125MSPS 8 bit ADC that uses a double sampling approach implemented in a 0.35 $\mu$m process for use in a 10/110/1000) Ethernet physical layer system.

Pipelined ADC 110 is illustratively based on a Standard 1.5b per stage pipelined ADC architecture that is well described in "A 10b 20MSAMPLES/SEC ANALOG-TO-DIGITAL CONVERTER," by S. Lewis, *J. of Solid-State Circuits*, pp. 281–87 (March 1992), which is incorporated herein by reference for all purposes as if fully set forth herein. Pipelined ADC 11C includes sample and hold circuitry 15, seven sub-ADCs 120a to 120g, and digital correction logic 125.

An input voltage signal Vin(t) is provided to sample and hold amplifier SHA. The output voltage of SHA that is provided to Stage 1 is denoted Vin. As shown in FIG. 1, Stage 1 comprises sample and hold circuitry 115. Sample and hold circuitry 115 comprises an analog to digital converter (ADC), and two digital to analog converters (DAC). The digital output signal of ADC that is provided to digital correction logic 125 is denoted $f_{CLK}$. The output of ADC is provided to the two digital to analog converters DAC. As is well known in the art, the analog output of the DACs is subtracted from the analog input Vin to produce an analog residue signal. The analog residue signal is provided to a single multiplexed amplifier. The output of the single multiplexed amplifier is denoted Vout. Digital signal $f_{CLK/2}$ is output from the first DAC and the inverse of digital signal $f_{CLK/2}$ is output from the second DAC to switch the output of the single multiplexed amplifier. The details of the operation of sample and hold circuitry are described in the paper by S. Lewis mentioned above.

Figure 2:
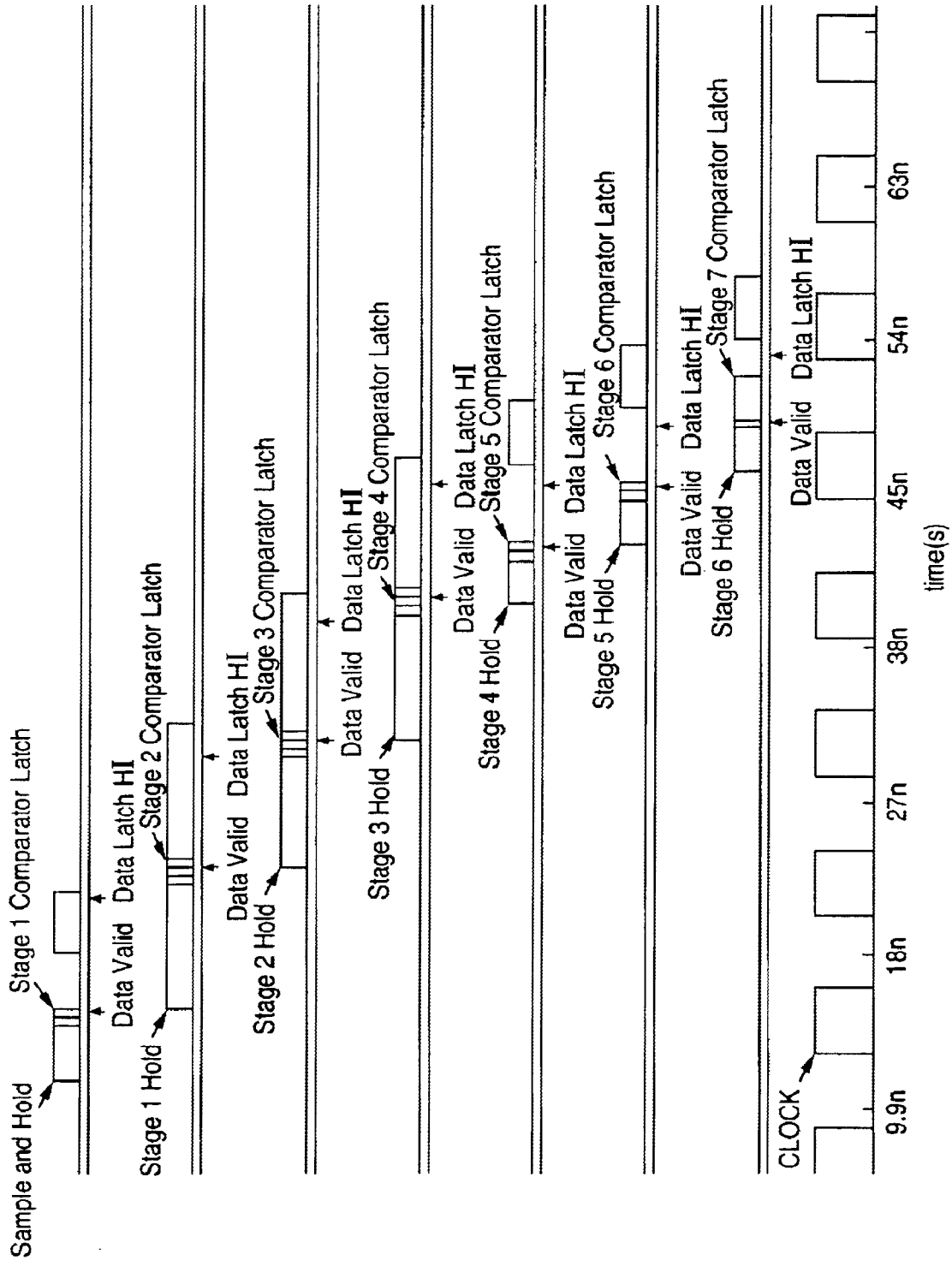
FIG. 2 illustrates an exemplary timing diagram of a prior art clocking scheme that may be used with a pipelined analog-to-digital converter, such as that of FIG. 1.

Turning concurrently to FIG. 2, illustrated is an exemplary timing diagram of a clocking scheme that may be used with pipelined ADC 110 of the present invention. Pipelined ADC 110 uses a technique commonly known as "double sampling" to double effectively the speed of the pipeline. Double sampling is well described in "8b 75MSAMPLES/SEC 70 mW PARALLEL PIPELINED ADC INCORPORATING DOUBLE SAMPLING," by W. Bright, *ISSCC98, Session 9 ADCs, Paper FA 9.5* (1998), which is incorporated herein by reference for all purposes as if fully set forth herein.

The line at the bottom of FIG. 2 illustrates the operation of CLOCK signal on a time scale. The letter "n" on the time scale denotes one nanosecond. FIG. 2 shows the timing for each "Hold" signal, and for each "Comparator Latch" signal, and for each "Data Valid" signal, and for each "Data Latch HI" signal for each stage of the seven (7) stages of the prior art pipelined ADC 110 shown in FIG. 1.

Traditionally, a pipelined ADC uses two semi-independent pipelines each clocked at one half the sampling frequency of the system where the clock to one converter is delayed by one half the clock cycle. This architecture suffers from many error sources.

In contrast, the double sampling system used in this design employs "single sampling" sample and hold circuitry 115 to drive two independent sampling systems in the first stage where there is a single amplifier. The amplifier works in the hold mode throughout the entire clock cycle except for a small period before switching between the two sampling networks where a reset phase restores amplifier outputs to a common mode voltage, as is illustratively depicted by sub-ADC 120a in FIG. 1.

According to the simplified diagram of the clocking scheme illustrated in FIG. 2, a reset phase is indicated by the dead band between subsequent hold phases. A 125 MHz sampling clock is divided by two on the rising edges to produce a non-overlapping two phase 62.5 MHz sampling clock, with duty cycle variation minimized which allows for a design with maximum sample and hold times.

A primary advantage of this scheme is to increase sample and hold times by more than a factor of two. However, because two sampling systems are used, capacitor matching requirements may be doubled, although this is mitigated by the reduction in error obtained by using capacitor swapping. In the instant embodiment, the sample and hold amplifier SHA is a single sampling system, whereas exemplary sub-ADC stages 1 to 6 (120a to 120f) are double sampling.

Exemplary digital correction logic 125 includes a plurality of overlapping three-state adders (shown with reference to FIGS. 3 to 6) in accordance with the principles of the present invention. Thus, digital correction logic 125 resembles generally the overlapping adders traditionally used by pipelined ADCs, wherein each stage of a pipelined ADC produces two bits of data.

Two data bits have four possible combinations, namely, "00," "01," "10" and "11." However, each stage of a 1.5b per stage pipelined ADC, such as ADC 110, has but three valid states, namely, "00," "01" and "10;" put differently, logic state "11" is unused. Accordingly, circuit logic necessary for performing three-state binary addition is simpler relative to circuit logic for a full adder.

Turning to TABLE 1, illustrated is an exemplary digital correction scheme:

principles of the present invention. Exemplary corrected adder cell 300 illustratively includes an XOR gate 310 to perform the summing function in parallel with a NAND gate 315 to perform the carry function. The logic function of corrected adder cell 300 is given by:

$$S = A\,XOR\,B \quad (1)$$

$$CO = A \cdot B \quad (2)$$

According to this embodiment, the minimum logic necessary to implement Case 1, or the first one of the three corrected adder cells, is as shown in TABLE 3.

TABLE 3

| A | B | S | CO |
|---|---|---|----|
| 0 | 0 | 0 | 0 |
| 0 | 1 | 1 | 0 |
| 1 | 0 | 1 | 0 |
| 1 | 1 | 0 | 1 |

One aspect of exemplary corrected adder cell 300 is that the carry out term is inverted. This logic performs the function of a half adder and is capable of reducing one gate delay through the exemplary carry out chain. A well known method for designating an inverted signal places a bar over the letter that represents the signal. A second well known

TABLE 1

| | | | | | | | | |
|---|---|---|---|---|---|---|---|---|
| STAGE 1 | $c13^0$ | $d12^1$ | | | | | | |
| STAGE 2 | | $d11^0$ | $d10^1$ | | | | | |
| STAGE 3 | | | $d09^0$ | $d08^1$ | | | | |
| STAGE 4 | | | | $d07^0$ | $d06^1$ | | | |
| STAGE 5 | | | | | $d05^0$ | $d04^1$ | | |
| STAGE 6 | | | | | | $d03^0$ | $d02^1$ | |
| STAGE 7 | | | | | | | $d01^0$ | $d00^1$ |
| | DATA $7^1$ | DATA $6^0$ | DATA $5^0$ | DATA $4^0$ | DATA $3^0$ | DATA $2^0$ | DATA $1^0$ | DATA $0^1$ |

According to TABLE 1, the data bits are generated at successive stages and are added with one data bit of overlap to generate an eight-bit output. By way of example, each of Stage 1 to Stage 7 includes a possible code in the upper right hand corner. The summed result for this example is located in top right hand corner of the bottom row cells, namely, the data 0 cell.

According to one advantageous embodiment, three corrected adder cells may be used to reduce the circuit logic relative to a full adder and to generate a three-state binary adder according to the principles of the present invention. According to this embodiment, the three corrected adder cells were created for three adding circumstances, namely:

TABLE 2

| CASE NO. | STAGE(S) |
|----------|----------|
| 1 | The overlap addition of Stage 7 |
| 2 | The overlap addition of Stages 6 to 2 |
| 3 | Carry over to d13 of Stage 1 (See TABLE 1). |

Turning to FIG. 3, illustrated is a block diagram of an exemplary first one of three corrected adder cells (generally designated 300) that may be used to reduce the circuit logic to generate a three-state binary adder according to the method for designating an inverted signal places a lower case letter "b" after the letter. The inverted carry out bit in FIG. 3 is designated with the letters Cob.

Turning to FIG. 4, illustrated is a block diagram of an exemplary second one of three corrected adder cells 400 that may be used to reduce the circuit logic to generate a three-state binary adder according to the principles of the present invention. Exemplary corrected adder cell 400 illustratively includes sub-circuitry operable to determine a sum (generally designated 405) and a carry (generally designated 410). Corrected adder cell 400 receives three inputs, namely, A (most significant bit ("MSB")), B (least significant bit ("LSB")), and CI (the carry-out bit generated by corrected adder cell 300). Exemplary summing sub-circuitry 405 in FIG. 4 includes a NAND gate 415 in series with a XNOR gate 420 to perform the summing function. Exemplary carry sub-circuitry 410 in FIG. 4 includes two inverters 425 and 430 in series with AND gate 435 in series with a NOR gate 440 to perform the carry function. The logic function of corrected adder cell 400 is given by:

$$S = B\,XNOR\,\overline{(A+CI)} \quad (3)$$

$$CO = B(A + CI) \quad (4)$$

According to this embodiment, the minimum logic necessary to implement Case 2, or the of the three corrected adder cells, is as shown in TABLE 4.

TABLE 4

| CI | A | B | S | CO |
|----|---|---|---|----|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | x | x |
| 1 | 1 | 0 | 0 | 1 |
| 1 | 1 | 1 | x | x |

One aspect of exemplary corrected adder cell 400 is that TABLE 4 characterizes all valid cases implied by Case 2, with the constraint that no stage will output a binary code value of "11."

Figure 5:
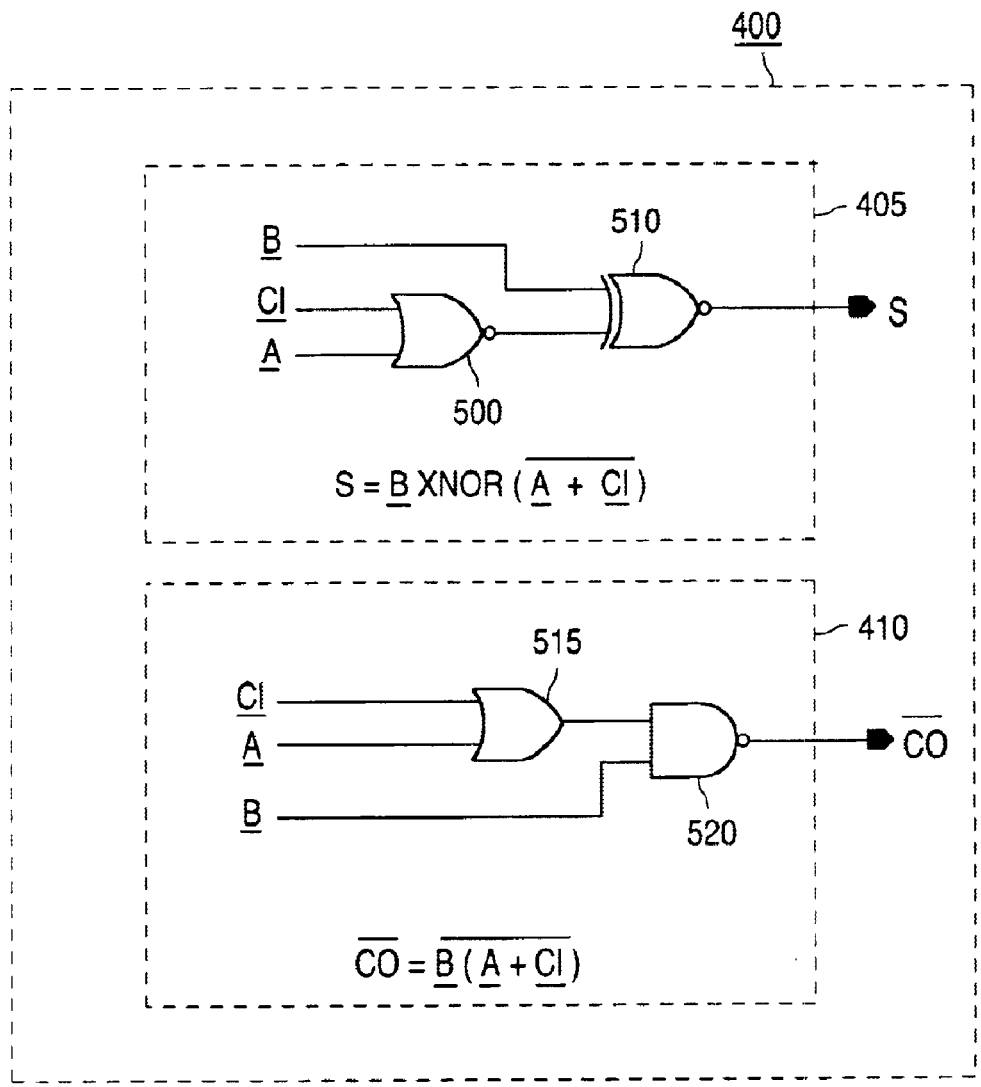
FIG. 5 illustrates a block diagram of an alternate embodiment of the second one of three corrected adder cells introduced with reference to FIG. 4.

Turning to FIG. 5, illustrated is a block diagram of an alternate embodiment of the second one of three corrected adder cells (generally designated 400) introduced with reference to FIG. 4. Exemplary alternate corrected adder cell 400 illustratively includes sub-circuitry operable to determine a sum (generally designated 405) and a carry (generally designated 410). Corrected adder cell 400 again receives three inputs, namely, A (most significant bit ("MSB")), B (least significant bit ("LSB")), and CI (the carry-out bit generated by corrected adder cell 300). Exemplary summing sub-circuitry 405 in FIG. 5 includes a NOR gate 500 in series with a XNOR gate 510 to perform the summing function. Exemplary carry sub-circuitry 410 in FIG. 5 includes an OR gate 515 in series with a NAND gate 520 to perform the carry function.

Figure 6:
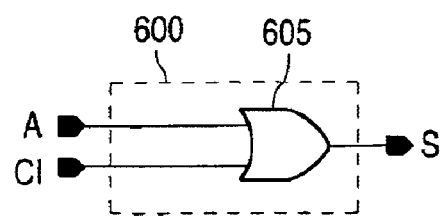
FIG. 6 illustrates a block diagram of a third one of three corrected adder cells that may be used to reduce the circuit logic to generate a three-state binary adder according to the principles of the present invention.

Turning to FIG. 6, illustrated is a block diagram of a third one of three corrected adder cells (generally designated 600) that may be used to reduce the logic circuit to generate a three-state binary adder according to the principles of the present invention. Exemplary corrected adder cell 600 illustratively includes sub-circuitry operable to determine a sum (generally designated 605). Corrected adder cell 600 receives two inputs, namely, A (most significant bit ("MSB")) and CI (the carry-out bit generated by corrected adder cell 400). Exemplary summing sub-circuitry 605 includes an OR gate 610 to perform the summing function. The logic function of corrected adder cell 600 is given by:

$$S = A + CI \quad (5)$$

According to this embodiment, the minimum logic necessary to implement Case 3, or the third one of the three corrected adder cells, is as shown in TABLE 5.

TABLE 5

| A (d13) | CI | S | CO |
|---------|----|----|----|
| 0 | 0 | 0 | 0 |
| 0 | 1 | 1 | 0 |
| 1 | 0 | 1 | 0 |
| 1 | 1 | x | x |

Corrected adder cell 600 is simply a carry over into the MSB. A carry out signal is nor generated.

Figure 7:
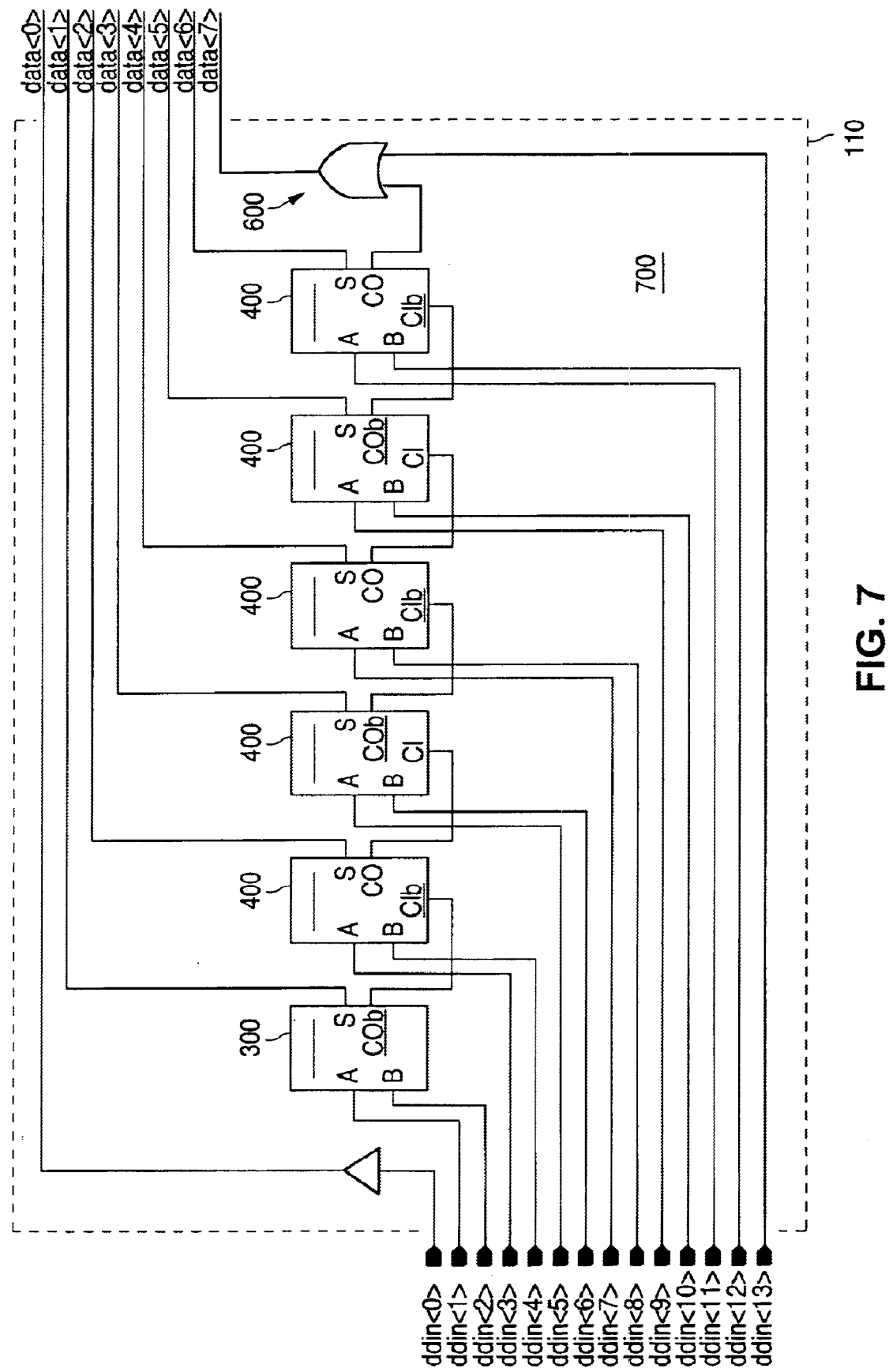
FIG. 7 illustrates a block diagram of the pipelined analog-to-digital converter of FIG. 1 which includes a fully corrected adder in accordance with the principles of the present invention.

Turning to FIG. 7, illustrated is a block diagram of pipelined ADC 110 which includes a fully corrected adder (generally designated 700) in accordance with the principles of the present invention. Exemplary fully corrected adder 700 illustratively includes one corrected adder cell 300 (Case 1), five corrected adder cells 400 (Case 2) and one corrected adder cell 600 (Case 3). According to this embodiment, a maximum delay from data in (from input lines ddin<0> through ddin<13>) to valid data out (from output lines data<0> through data<7>) occurs at the transition from code 127 to code 128. In this case, the LSB forces a carry out for each stage of the adder until the MSB toggles. To reduce this delay, the corrected adder cells are arranged to provide an inversion of the carry out signal between each stage, thereby reducing the maximum delay by one inverter delay per stage. Important aspects of this implementation, and the principles of the present invention, include that this scheme is easily scalable, significantly reduces delay, and requires less area than an overlapping adder using standard full-adder and half-adder cells. The letter "b" after the letters "CI" in FIG. 7 indicates the inverse value of the carry in (CI) signal.

Figure 8:
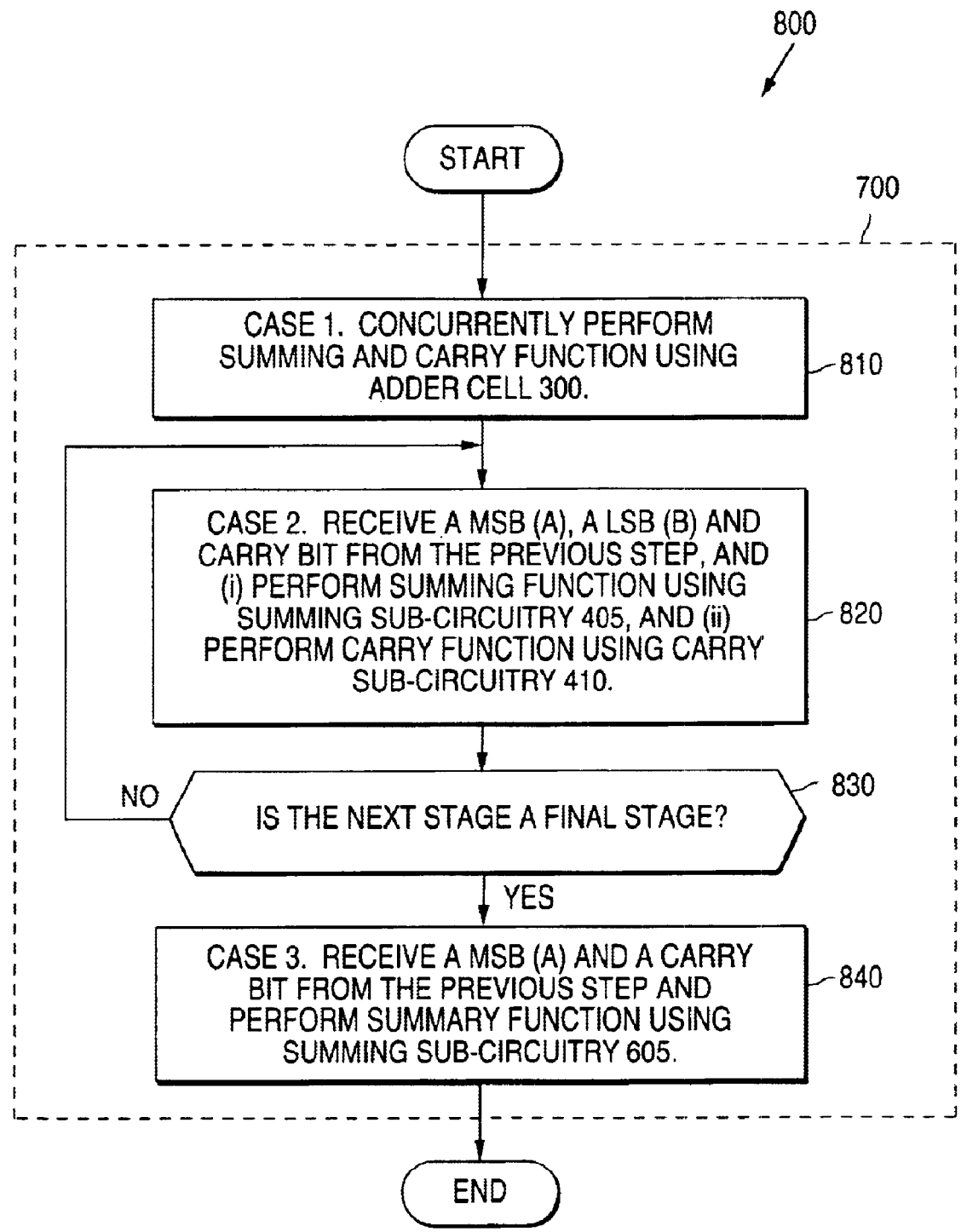
FIG. 8 illustrates a flow diagram of a method of operating the fully corrected adder of FIG. 7 in accordance with the principles of the present invention.

Turning to FIG. 8, illustrated is a flow diagram of a method (generally designated 800) of operating the fully corrected adder 700 in accordance with the principles of she present invention. For purposes of illustration, concurrent reference is made to FIGS. 3 to 7. To begin, enter Case 1 (process step 810), adder cell 300 concurrently performs (i) the summing function, summing signals A and B using XOR gate 310, and (i) the carry function, processing signals A and B using NAND gate 315.

Enter Case 2 (process step 820), and receive three inputs into corrected adder cell 400, namely, A (MSB), B (LSB), and CI (the carry-out bit generated by corrected adder cell 300). Perform (i) summing function using sub-circuitry 405, which includes NAND gate 415 in series with XNOR gate 420, and (ii) carry function using carry sub-circuitry 410, which includes two inverters 425 and 430 in series with AND gate 435 in series with a NOR gate 440.

Repeat Case 2 so long as next processing stage is not last processing stage (determination step 830). Upon a determination that the next processing stage is the last processing stage (YES branch of determination step 830), enter Case 3 (process step 840) and receive two inputs into corrected adder cell 600 receives two inputs, namely, A (MSB) and CI (the carry-out bit generated by corrected adder cell 400) Perform summing function using summing sub-circuitry 605, which includes OR gate 610.

It should be noted that the functionality and cooperation provided by the exemplary circuitry discussed herein may suitably be provided or implements in alternate circuit logic. Further, although the principles of the three-state binary adder disclosed herein were disclosed in connection with an advantageous implementation of a pipelined ADC, the principles of the three-state binary adder hereof may be associated with any suitable digital signal processing system, for instance, an Ethernet card, an arithmetic logic unit, a math co-processor, etc., wherein an optimized binary adder has been developed to exclude a particular state.

Although the present invention has been described in detail, those skilled in the art should understand that they can make various changes, substitutions and alterations herein without departing from the spirit and scope of the invention in its broadest form.

What is claimed is:

1. For use in a digital signal processing system, a three-state binary adder comprising:
   a first corrected adder cell;
   a plurality of second corrected adder cells; and
   a third corrected adder cell.

2. The three-state binary adder as claimed in claim 1 wherein the first corrected adder cell comprises:
   an exclusive NOR gate capable of receiving a first input value and a second input value, said exclusive NOR gate having an output that represents a sum of said first input value and said second input value; and
   a NAND gate coupled in parallel with said exclusive NOR gate to receive said first input value and said second input value, said NAND gate having an output that provides an inverted carry out bit from the sum performed by said exclusive NOR gate.

3. The three-state binary adder as claimed in claim 1 wherein at least one of the second corrected adder cells comprises:
   a first sub-circuit capable of determining a sum of a first input value, and a second input value, and a value of a carry in bit; and
   a second sub-circuit associated with said first sub-circuit, wherein said second sub-circuit is capable of determining a carry out bit for the sum performed by said first sub-circuit using said first input value, and said second input value, and said value of said carry in bit.

4. The three-state binary adder as claimed in claim 3 wherein said first sub-circuit comprises:
   a NAND gate capable of receiving an inverted value of said first input value and an inverted value of said carry in bit; and
   an exclusive NOR gate coupled in series with said NAND gate, said exclusive NOR gate capable of receiving an inverted value of said second input value on a first input of said exclusive NOR gate and capable of receiving the output of said NAND gate on a second input of said exclusive NOR gate, said output of said exclusive NOR gate representing said sum performed by said first sub-circuit.

5. The three-state binary adder as claimed in claim 3 wherein said second sub-circuit comprises:
   an AND gate capable of receiving an inverted value of said value of said carry in bit and an inverted value of said first input value; and
   a NOR gate coupled in series with said AND gate, said NOR gate capable of receiving an inverted value of said second input value on a first input of said NOR gate and capable of receiving the output of said AND gate on a second input of said NOR gate, said output of said NOR gate representing said determination of said carry out bit performed by said second sub-circuit.

6. The three-state binary adder as claimed in claim 3 wherein said first sub-circuit comprises:
   a NOR gate capable of receiving a value of said first input value and a value of said carry in bit; and
   an exclusive NOR gate coupled in series with said NOR gate, said exclusive NOR gate capable of receiving a value of said second input value on a first input of said exclusive NOR gate and capable of receiving the output of said NOR gate on a second input of said exclusive NOR gate, said output of said exclusive NOR gate representing said sum performed by said first sub-circuit.

7. The three-state binary adder as claimed in claim 3 wherein said second sub-circuit comprises:
   an OR gate capable of receiving said value of said carry in bit and a value of said first input value; and
   a NAND gate coupled in series with said OR gate, said NAND gate capable of receiving a value of said second input value on a first input of said NAND gate and capable of receiving the output of said OR gate on a second input of said NAND gate, said output of said NAND gate representing an inverted value of a carry out bit determined by said second sub-circuit.

8. The three-state binary adder as claimed in claim 1 wherein the third corrected adder cell comprises:
   an OR gate capable of receiving a first input value on a first input of said OR gate and capable of receiving a value of a carry in bit on a second input of said OR gate, said OR gate having an output that represents a sum of said first input value and said value of said carry in bit.

9. A pipelined analog-to-digital converter, comprising:
   a plurality of three-state binary adders coupled in series;
   wherein said plurality of three-sate binary adders coupled in series comprises:
      a first corrected adder cell;
      a plurality of second corrected adder cells; and
      a third corrected adder cell.

10. The pipelined analog-to-digital converter of claim 9, wherein each of the three-state binary adders is capable of generating binary codes representing only three different states.

11. The pipelined analog-to-digital converter as claimed in claim 10 wherein a carry out bit from each second corrected adder cell of said plurality of second corrected adder cells is inverted.

12. The pipelined analog-to-digital converter as claimed in claim 10 wherein said first corrected adder cell comprises:
   an exclusive NOR gate capable of receiving a first input value and a second input value, said exclusive NOR gate having an output that represents a sum of said fins input value and said second input value; and
   a NAND gate coupled in parallel with said exclusive NOR gate to receive said first input value and said second input value, aid NAND gate having an output that provides an inverted carry out bit from the sum performed by said exclusive NOR gate.

13. The pipelined analog-to-digital converter as claimed in claim 10 wherein each second corrected adder cell of said plurality of second corrected adder cell comprises:
   a first sub-circuit capable of determining a sum of a first input value, and a second input value, and a value of a carry in bit; and
   a second sub-circuit associated with said first sub-circuit, wherein said second sub-circuit is capable of determining a carry out bit for the sum performed by said first sub-circuit using said first input value, and said second input value, and said value of said carry in bit.

14. The pipelined analog-to-digital converter as claimed in claim 13 wherein said first sub-circuit comprises:
   a NOR gate capable of receiving a value of said first input value and a value of said carry in bit; and
   an exclusive NOR gate coupled in series with said NOR gate, said exclusive NOR gate capable of receiving a value of said second input value on a first input of said exclusive NOR gate and capable of receiving the output of said NOR gate on a second input of said exclusive NOR gate, said output of said exclusive NOR gate representing said sum performed by said first sub-circuit; and
   wherein said second sub-circuit comprises:
      an OR gate capable of receiving said value of said carry in bit and a value of said first input value; and
      a NAND gate coupled in series with said OR gate, said NAND gate capable of receiving a value of said second input value on a first input of said NAND gate and capable of receiving the output of said OR gate on a second input of said NAND gate, said output of said NAND gate representing an inverted value of a carry out bit determined by said second sub-circuit.

15. The pipelined analog-to-digital converter as claimed in claim 10 wherein said third corrected adder cell comprises:

an OR gate capable of receiving a first input value on a first input of said OR gate and capable of receiving a value of a carry in bit on a second input of said OR gate, said OR gate having an output that represents a sum of said first input value and said value of said carry in bit.

16. A method for operating a pipelined analog-to-digital converter comprising the steps of:

summing a first input value and a second input value in a first corrected adder cell of said pipelined analog-to-digital converter; and concurrently performing in said first corrected adder cell a carry function for said sum of said first input value and said second input value.

17. The method as claimed in claim 16 further comprising the steps of:

receiving in a second corrected adder cell of said pipelined analog-to-digital converter a first input value representing a most significant bit, and a second input value representing a least significant bit, and an inverted value of a carry in bit from a previous calculation;

summing in a first sub-circuit of said second corrected adder cell said first input value and said second input value; and performing a carry function in a second sub-circuit of said second corrected adder cell to determine a carry out bit for the sum performed by said first sub-circuit using said first input value, and said second input value, and said value of said carry in bit.

18. The method as claimed in claim 17 further comprising the steps of:

receiving in each second corrected adder cell of a plurality of second corrected adder cells of said pipelined analog-to-digital converter a first input value representing a most significant bit, and a second input value representing a least significant bit, and an inverted value of a carry in bit from a previous calculation;

summing in a first sub-circuit of said each second corrected adder cell said first input value and said second input value; and performing a carry function in a second sub-circuit of said each second corrected adder cell to determine a carry out bit for the sum performed by said first sub-circuit using said first input value, and said second input value, and said value of said carry in bit.

19. The method as claimed in claim 18 further comprising the steps of:

receiving in a third corrected adder cell of said pipelined analog-to-digital converter a first input value representing a most significant bit, and a second input value representing a value of a carry in bit from a previous calculation; and summing said first input value and said second input value.

20. The method as claimed in claim 19 further comprising the step of:

providing an output value from said first corrected adder cell of said pipelined analog-to-digital converter to represent a first digit of a binary number output from said analog-to-digital converter;

providing an output value from said each second corrected adder cell of said plurality of second corrected adder cells of said pipelined analog-to-digital converter to represent an intermediate digit of said binary number output from said analog-to-digital converter; and providing an output value from said third corrected adder cell of said pipelined analog-to-digital converter to represent a final digit of a binary number output from said analog-to-digital converter.

* * * * *

UNITED STATES PATENT AND TRADEMARK OFFICE
CERTIFICATE OF CORRECTION

PATENT NO. : 6,859,387 B1
DATED : February 22, 2005
INVENTOR(S) : Arlo J. Aude et al.

It is certified that error appears in the above-identified patent and that said Letters Patent is hereby corrected as shown below:

Column 3,
Line 36, delete "so" and replace with -- of --;

Column 4,
Line 6, delete "10/110/1000)" and replace with -- 10/100/1000 --;
Line 14, delete "15" and replace with -- 115 --;

Column 5,
Line 30, Table 1, delete "$c13^0$" and replace with -- $d13^0$ --;

Column 8,
Line 27, delete "(i)" and replace with -- (ii) --;

Column 10,
Line 32, delete "fins" and replace with -- first --.
Line 36, delete "aid" and replace with -- said --.

Signed and Sealed this

Fourth Day of April, 2006

JON W. DUDAS
*Director of the United States Patent and Trademark Office*